United States Patent
Chiu et al.

(10) Patent No.: US 7,235,153 B2
(45) Date of Patent: Jun. 26, 2007

(54) SYSTEM FOR REMOVAL OF A SPACER

(75) Inventors: Hsien-Kuang Chiu, Hsin-Chu (TW); Chih-Hao Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 293 days.

(21) Appl. No.: 10/894,199

(22) Filed: Jul. 19, 2004

(65) Prior Publication Data

US 2005/0009283 A1   Jan. 13, 2005

Related U.S. Application Data

(62) Division of application No. 10/614,388, filed on Jul. 7, 2003, now Pat. No. 6,777,299.

(51) Int. Cl.
*H01L 21/336* (2006.01)

(52) U.S. Cl. ............. 156/345.1; 118/722; 257/E21.435

(58) Field of Classification Search .. 156/345.1–345.5; 118/715–733; 257/E21.435
See application file for complete search history.

(56) References Cited

U.S. PATENT DOCUMENTS

| | | | |
|---|---|---|---|
| 4,745,086 A | 5/1988 | Parillo et al. | |
| 5,766,969 A | 6/1998 | Fulford, Jr. et al. | |
| 5,766,991 A | 6/1998 | Chen | |
| 5,866,448 A | 2/1999 | Pradeep et al. | |
| 5,879,999 A | 3/1999 | Park et al. | |
| 6,087,239 A | 7/2000 | Juengling | |
| 6,104,063 A | 8/2000 | Fulford et al. | |
| 6,203,657 B1 * | 3/2001 | Collison et al. | 156/345.48 |
| 6,309,936 B1 | 10/2001 | Gardner et al. | |
| 6,323,077 B1 * | 11/2001 | Guo | 438/231 |
| 6,483,154 B1 | 11/2002 | Ngo et al. | |
| 6,518,136 B2 | 2/2003 | Lee et al. | |
| 6,518,137 B2 | 2/2003 | Hsieh et al. | |
| 6,579,783 B2 | 6/2003 | Saigal et al. | |
| 6,660,605 B1 | 12/2003 | Liu | |
| 6,764,385 B2 * | 7/2004 | Boumerzoug et al. | 451/39 |
| 6,764,552 B1 * | 7/2004 | Joyce et al. | 134/3 |
| 2001/0019150 A1 | 9/2001 | Kawal et al. | |
| 2001/0041409 A1 | 11/2001 | Jeng et al. | |

* cited by examiner

*Primary Examiner*—Marcos D. Pizarro
(74) *Attorney, Agent, or Firm*—Haynes and Boone, LLP

(57) ABSTRACT

The present disclosure provides a system for removing a spacer, such as associated with a processing operation using a lightly doped drain (LDD) region. In one example, the system includes means for creating a spacer, means for implanting a first relatively heavily doped region with the spacer in place, one or more chambers for removing the spacer, and means for implanting the LDD region with the spacer removed. The one or more chambers may be configured for applying a first dry removal process to remove the layer on the spacer utilizing a fluorine-contained plasma and applying a second wet etch process to remove the spacer.

9 Claims, 7 Drawing Sheets

SYSTEM FOR REMOVAL OF A SPACER

RELATED APPLICATION

This application is a divisional of U.S. patent application Ser. No. 10/614,388 filed Jul. 7, 2003 now U.S. Pat. No. 6,777,299, and entitled, "Method for Removal of a Spacer," which is hereby incorporated by reference in its entirety.

BACKGROUND

The present disclosure relates generally to the fabrication of semiconductor devices, and more particularly, to a system for removing a spacer used to define the lightly doped drain (LDD) regions in Metal Oxide Semiconductor Field Effect Transistor (MOSFET) fabrication.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 µm and even 90 nm feature sizes or smaller. As geometries shrink, semiconductor manufacturing methods often must be improved.

Traditional methods for fabricating the MOSFETs used in integrated circuit structures are becoming inadequate as device size shrinks. Conventional MOSFET fabrication utilizes a technique of building material spacers to help control and define the implantation of dopants in the source and drain regions of the MOSFET. One way to control the implantation of dopants is by using an LDD region in a semiconductor substrate between the channel region (e.g., the region of the substrate beneath a gate electrode and a gate oxide) and the more heavily doped source and drain regions. This LDD region between the channel and the more heavily doped conventional drain region reduces the electric field thereby mitigating short-channel effects, reducing hot-carrier generation, and increasing the junction breakdown voltage. The LDD region provides a gradual transition from the drain and/or source to the gate region. This transition area disburses any abrupt voltage changes and reduces the maximum electric field strength. A discussion of the LDD region may be found in S. Wolf, *Silicon Processing for the VLSI Era* 348 (Vol. 2, Lattice Press 1990).

Spacers are often used in the fabrication of LDD regions to facilitate the different levels of doping for the drain/source regions and the LDD regions. The LDD region can be controlled by the lateral spacer dimension and the thermal drive cycle, and can be independent from the source and drain implant depth. However, removing the spacer is critical because removal can damage adjacent structures, such as the gate and the underlying silicon substrate. This difficulty is exacerbated during the LDD formation process which can produce a hard polymer layer on top of the spacer, making its removal more difficult.

Other difficulties must also be considered. Layer thickness decreases and sensitivity to heat exposure (the thermal budget) needed to provide annealing and activation of dopants become critical as device geometries decrease. Also, transient enhanced diffusion (TED) can cause the LDD region to undesirably extend in both vertical and horizontal directions during the formation of such items as sidewall spacers. As device geometries shrink, the harmful effects of TED have become a greater problem, prompting efforts to eliminate any spacer made during the semiconductor fabrication.

SUMMARY

Provided is a new and improved system for removing a spacer, such as associated with a processing operation using a lightly doped drain (LDD) region. In one embodiment, the system includes means for creating a spacer and a first means for implanting a first relatively heavily doped region with the spacer in place. The system also includes one or more chambers for removing the spacer, the one or more chambers configured for applying a first dry process to remove the layer on the spacer, the first dry process utilizing a fluorine-contained plasma and applying a second wet etch process to remove the spacer. The system further includes a second means for implanting the LDD region with the spacer removed.

In some embodiments, the one or more chambers for removing the spacer is further configured for applying a third wet etch process to remove an oxide layer underlying the spacer.

DETAILED DESCRIPTION

The present invention provides a system for the removal of spacer material used in the fabrication of lightly doped drain (LDD) regions or LDD structures in a Metal Oxide Semiconductor Field Effect Transistor (MOSFET) on a semiconductor substrate. It is understood, however, that this specific example is only provided to teach the broader inventive concept, and one of ordinary skill in the art can easily apply the teachings of the present disclosure to other semiconductor devices and structures.

Referring now to FIG. 1(a)–1(i), the fabrication of an LDD structure in a MOSFET can utilize an enhanced spacer removal method which includes a dry plasma etch and a wet etch to reduce the probability of transient enhanced diffusion (TED).

Figure 1A:
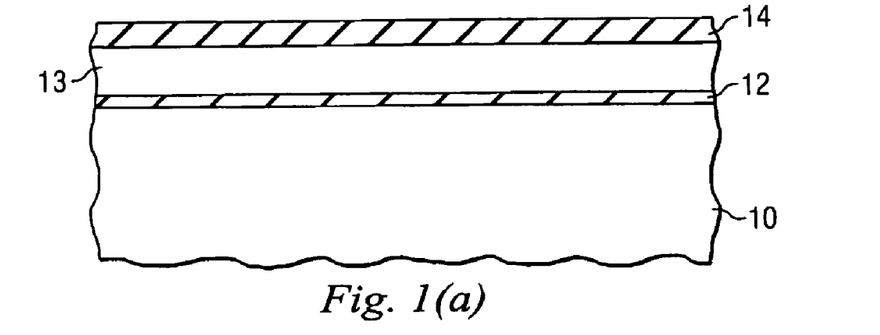
FIG. 1(a)–1(i) are cross-sectional views showing the present invention used in a conventional process for fabricating an LDD MOSFET, wherein the light ion/dopant implantation is done prior to the heavy ion/dopant implantation. The process ends with a dry etching of the spacer followed by a wet etching.

Referring specifically to FIG. 1(a), in this embodiment, a gate oxide layer 12 can be formed on a semiconductor substrate 10 such as silicon. In one example, the gate oxide layer 12 can be formed in a thermal oxidation furnace of approximately 700°–900° C. or higher for a relatively short time of less than 5 seconds to 60 minutes. The gate oxide layer 12 can also be formed, for example, over epitaxial silicon or silicon on insulator. The gate oxide film 12 may be formed in a batch process or a single semiconductor substrate 10 process where a single wafer process may utilize rapid thermal anneal (RTA) along with an insitu steam generation method, for example. Next, a polysilicon layer 13 and a cap gate oxide layer 14 can be formed on the gate oxide layer 12. The polysilicon layer 13 can be formed, for example, in a thermal oxidation furnace using temperatures of approximately 700°–900° C. or in an RTA apparatus in which the substrate is subjected to temperatures of approximately 700°–1000° C. for approximately 10 seconds-to 30 minutes. The cap gate oxide layer 14 can be formed, for example, in a thermal oxidation furnace of approximately 700°–900° C. or higher, for a relatively short time of less than 60 minutes or by chemical vapor deposition (CVD), plasma enhanced chemical vapor deposition (PECVD), and/or atomic layer deposition (ALD) at much lower processing temperatures.

Figure 1B:
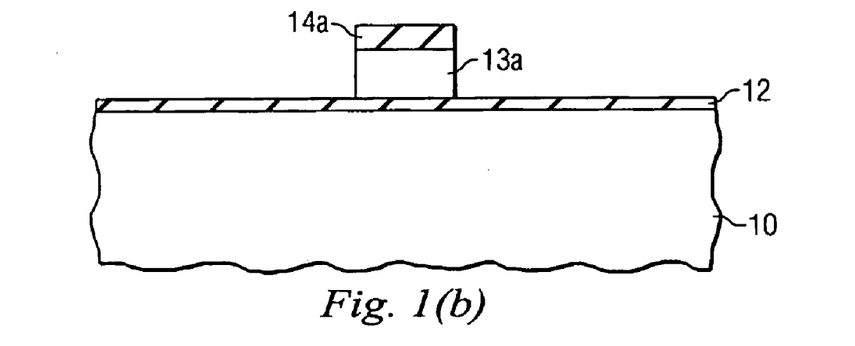

Referring to FIG. 1(b), the cap gate oxide layer 14 and the polysilicon layer 13 can be etched by applying a selective etching method to define a gate electrode 13a covered with an cap gate oxide layer 14 on the gate oxide layer 12. The layers may be formed in a chamber for performing CVD, PECVD, ALD, electro-chemical deposition, physical vapor deposition (PVD), or any other method that is known by one who is skilled in the art.

Figure 1C:
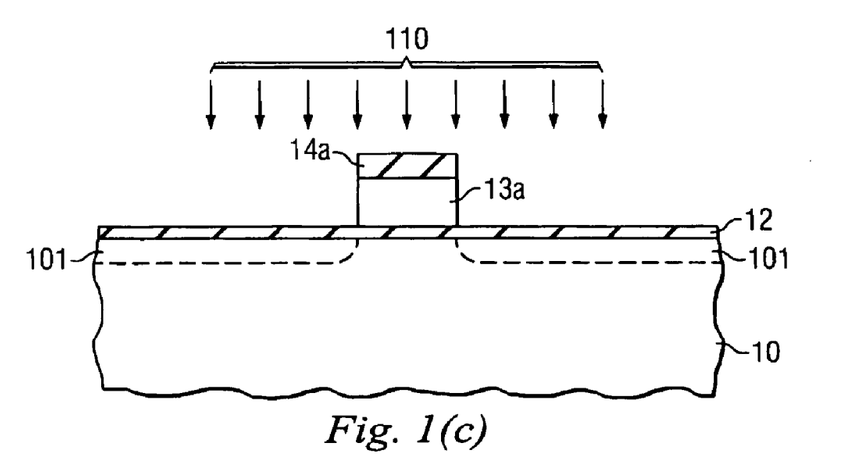

Referring to FIG. 1(c), a light dose of, for example, phosphorus ions and a low implanting energy can be used for a first ion implantation 110. The entire surface of the resulting structure shown in FIG. 1(b) can be implanted resulting in a lightly doped N-type source/drain region 101 of a MOSFET. Alternatively, the first ion implantation 110 may utilize boron ions or any other p-type dopant to from a P-type source/drain region 101 of a MOSFET.

Figure 1D:
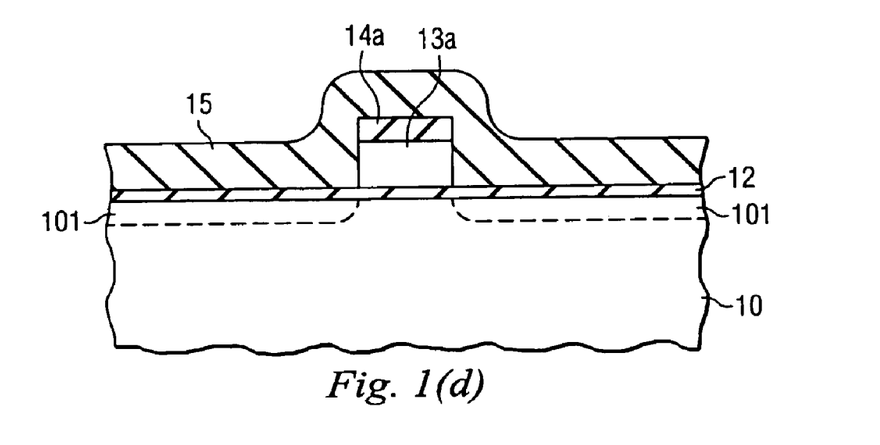

Referring to FIG. 1(d), a silicon oxide and/or silicon nitride layer 15 can be deposited over the entire surface of the resulting structure shown in FIG. 1(c) in a CVD or ALD chamber.

Figure 1E:
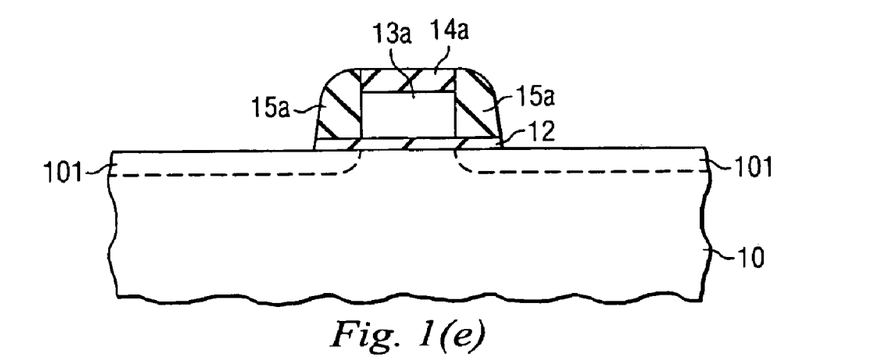

Referring to FIG. 1(e), the silicon oxide and/or silicon nitride layer 15 and the gate oxide layer 12 can be partially etched by a dry etching or plasma etching method such that part of the silicon oxide and/or silicon nitride layer 15 and the gate oxide layer 12 remain to form sidewall spacers 15a adjacent to each of opposite sides of the gate electrode 13a and the cap oxide layer 14a.

Figure 1F:
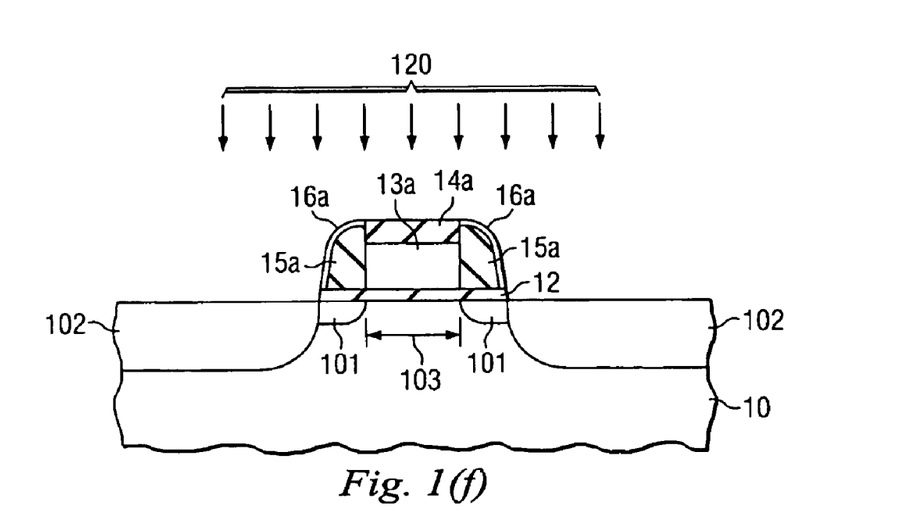

Referring now to FIG. 1(f), is placed into a chamber and using the sidewall spacers 15a as a mask, the surface of the fabrication is subjected to a second ion implantation 120. The second ion implantation 120, which can use arsenic ions, for example, has a different characteristic than the first implantation for forming the lightly doped N-type source/drain region 101. In the present example, the second ion implantation 120 uses a larger dose and a higher implanting energy than the first ion implantation 110. As a result, heavily doped N-type source and/or drain regions 102 are formed having deeper junctions than those of the lightly doped N-type source/drain region 101. Alternatively, a heavily p-type dopant may be used for a second ion implantation 120.

After the second ion implantation 120, the spacers 15a which contain a silicon oxide and/or silicon nitride layer 15 can become coated with or may form a polymer layer 16a. The polymer layer 16a can form during the second ion implantation 120 and can be due, in part, to residue from an earlier photoresist process. Although the silicon oxide and/or silicon nitride layers of 15a can be effectively removed using a wet etch with $H_3PO_4$ acid followed by a HF wet etch, using these types of wet etching processes to remove the polymer layer 16a can cause over etching which can lead to TED and damage to the underlying silicon substrate and gate structure. In another embodiment, particularly in geometries approaching 0.1 micron or less, the polymer layer 16a can be effectively removed by using a light dry or plasma etch 122. The light dry or plasma etch 122 can be used to remove the polymer layer 16a, and in some embodiments, a portion of the silicon oxide and/or silicon nitride layer 15 of the spacer 15a.

Figure 1G:
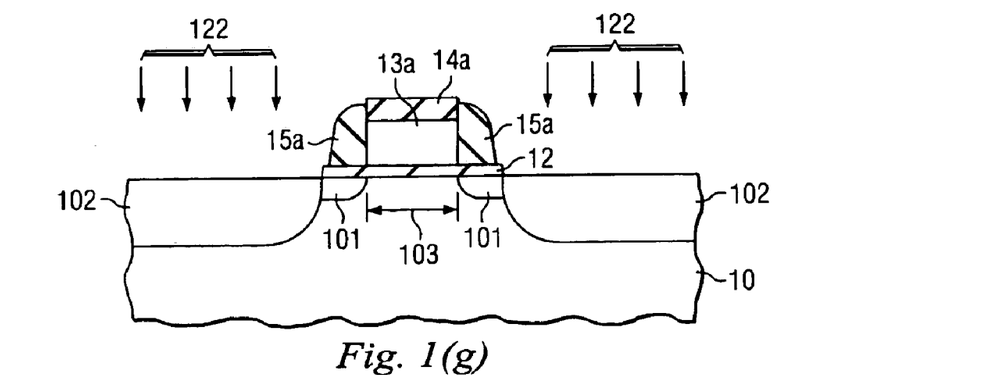

FIG. 1(g) shows the employment of a light dry etching process 122 to remove the polymer layer 16a. The etching process 122 can include many different processes for removing material. For example, a chamber for performing an ashing process can utilize oxygen and fluorine-contained plasma to remove (via volatilization) the desired material. Also, a single wafer plasma etch chamber can utilize a fluorine chemistry to be a prominent component of the plasma etch chemistry. Further examples of suitable dry etch chemistries include Ar and $O_2$ together with a reactant perfluorocarbon gas such as $CF_4$, $CHF_3$, $CH_2F_2$, or $CH_3F$. The oxygen component becomes partially ozone in the plasma environment, which aids in removing the polymer layer 16a, and the fluorine reactants also help to remove the polymer layer 16a. If a plasma etch is used, the plasma process can be on the order of 40~300 mTorr with a radio frequency (RF) power in the range of 150~1500 W to produce a temperature less than about 500° C. Process gas flows can vary according to the desired optimal process conditions, and examples include:

$CH_2F_2$=20~80 sccm; Ar=100~500 sccm; $O_2$=20~150 sccm;     example 1

$CH_3F$=10~50 sccm; Ar=100~500 sccm; $O_2$=20~150 sccm.     example 2

Figure 1H:
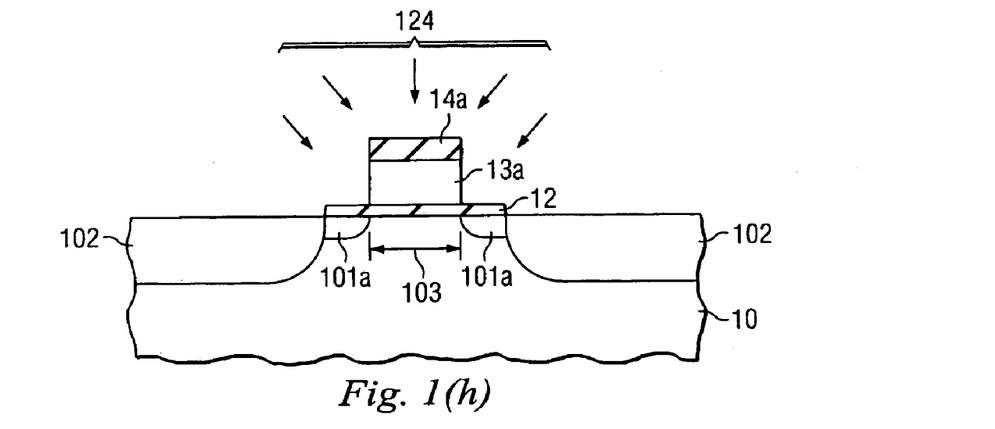

Referring to FIG. 1(h), in the same or different chamber, the spacer 15a can be removed (or further removed) with a light wet etch 124 using, for example, an $H_3PO_4$ acid. The light wet etch 124 can help to remove the spacers 15a and any residual of the polymer layer 16a. In some embodiments, the wet etch 124 can also remove some or all of the exposed portion of the silicon dioxide layer 12.

Figure 1I:
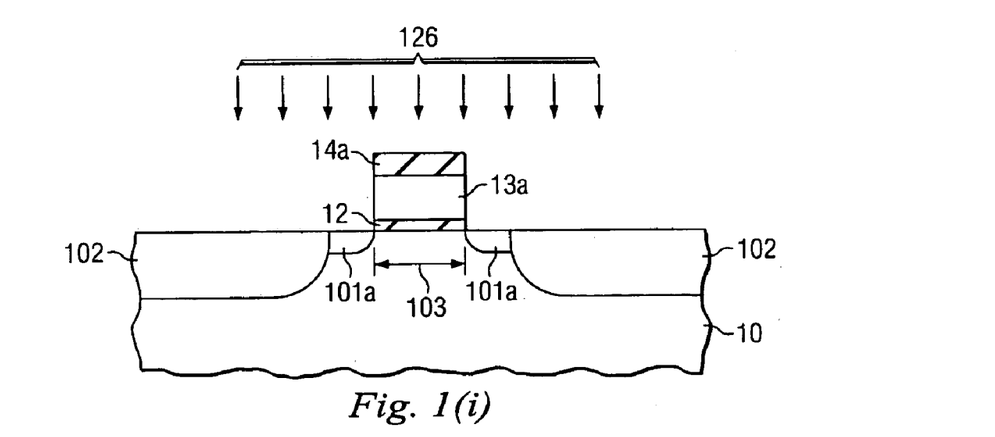

Referring to FIG. 1(i), in the same or different chamber, after the removal of the polymer layer 16a and the spacers 15a with the dry and wet etch processes, an additional wet etch 126 can be employed to remove the exposed portion of the silicon dioxide layer 12 (if not done so by the second etch). For example, a HF acid can be used. With the removal of the polymer layer 16a, the spacer 15a, and the silicon dioxide layer 12, the MOSFET structure is less susceptible to TED.

Referring now to FIGS. 2(a)–2(f), another method for fabricating an LDD MOSFET structure can incorporate the spacer removal method of the present invention into an inverse-sequence process. As discussed above, one or more of the layers may be formed by CVD, PECVD, electro-chemical deposition, PVD. ALD, or any other method that is known by one who is skilled in the art.

Figure 2A:
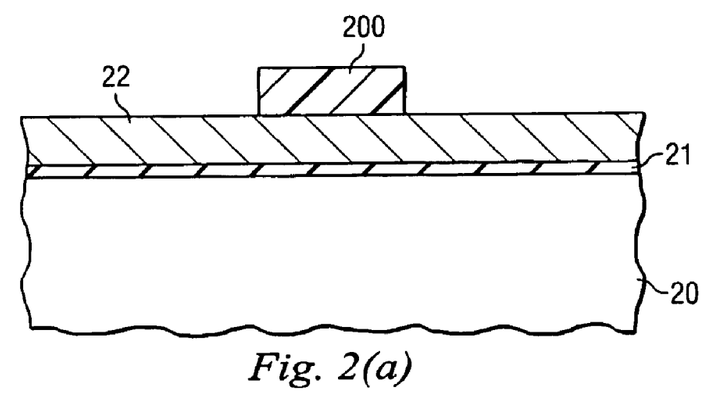
FIG. 2(a) to 2(j) are cross-sectional views showing the present invention used in a inverse-sequence process for fabricating an LDD MOSFET, wherein the heavy ion/dopant implantation is done prior to the light ion/dopant implantation. The process ends with a dry etching of the spacer followed by wet etching.

Referring specifically to FIG. 2(a), a gate oxide layer 21 is formed on a semiconductor substrate 20 such as silicon through a conventional heat treatment such as dry oxidation in a pure oxygen environment, for example. Another method for forming the gate oxide layer 21 could be by RTA with insitu steam generation and followed by nitridation by a nitrogen containing plasma source of a gate oxide layer 21 to provide an equivalent oxide thickness (EOT). Next a conductive layer 22, such as doped polysilicon layer, is formed on the gate oxide layer 12 through a method such as CVD, PECVD, ALD, or PVD. The conductive layer 22 can comprise a plurality of laminated layers such as, a doped polysilicon layer, a tungsten silicide layer, and a silicon nitride layer forming on a silicon oxide layer. The polysilicon layer or conductive layer 22 can be formed in a thermal oxidation furnace using temperatures of approximately 700°–900° C. or in a rapid thermal annealing (RTA) apparatus in which the substrate can be subjected to temperatures of approximately 700°–1000° C. for approximately 10 seconds to 30 minutes. Subsequently, a patterned photoresist layer 200 can be formed on the conductive layer 22 through conventional photolithography or other lithographic processes.

Figure 2B:
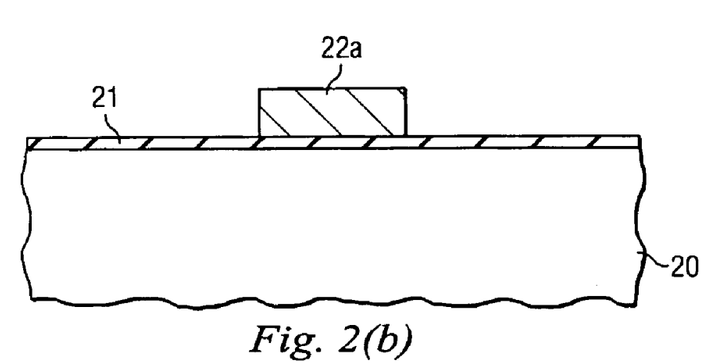

Referring to FIG. 2(b), the conductive layer 22 can be selectively etched by using the photoresist layer 200 as a mask so as to define a gate electrode 22a on the gate oxide layer 21. The resulting structure can be heated and annealed in a conventional furnace (not shown) or an RTA (not shown).

Figure 2C:
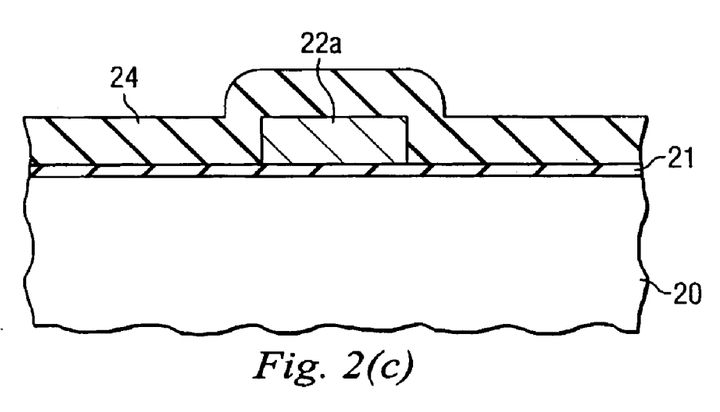

Referring to FIG. 2(c), an insulating layer 24 made of, for example, silicon nitride can be deposited over the surface of the resulting structure shown in FIG. 2(b) through the CVD, PECVD, ALD method.

Figure 2D:
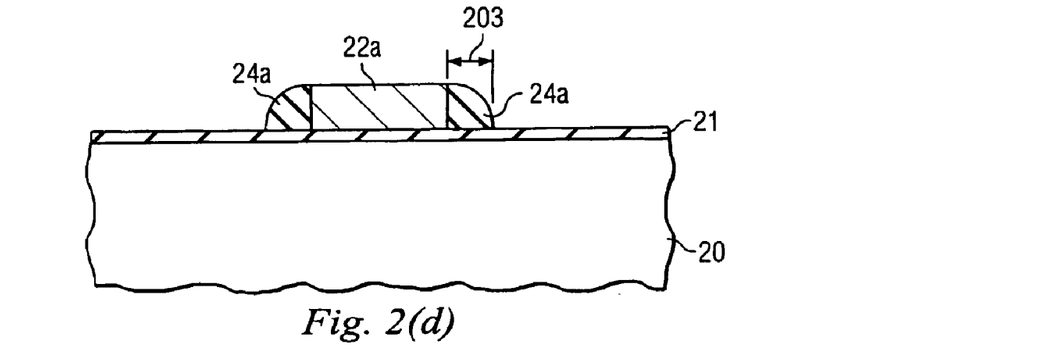

Referring to FIG. 2(d), the insulating layer 24 can be partially etched through a reactive ion etching (RIE), inductively coupled plasma source (ICP), electro cyclotron resonance (ECR) microwave plasma source, or helicon plasma source etching method or other appropriate process so that part of the insulating layer 24 remains to form disposable sidewall spacers 24a adjacent to each of opposite sides of the gate electrode 22a.

Figure 2E:
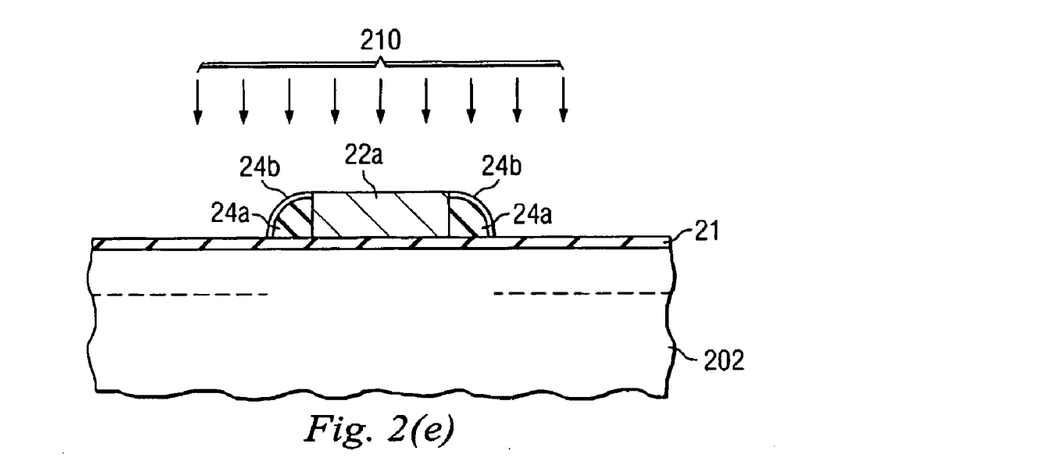

Referring to FIG. 2(e), using the gate electrode 22a and the disposable sidewall spacers 24a as a mask, the surface of the structure can be subjected to a first ion implantation 210 using, for example, arsenic ions. The first ion implantation 210 forms heavily doped N-type source/drain regions 202 having deep junctions within the semiconductor substrate 10. The first ion implantation 210 can involve a process whereby the semiconductor substrate(s) 20 are processed on a large rotating wheel in a high vacuum environment (not shown). An ion beam of the dopant can be raster scanned across the semiconductor substrate(s) 20 as the wheel carrying the semiconductor substrate(s) 20 are rotated. As a result of the first ion implantation 210, a polymer layer 24b can be developed over the LDD region. The polymer layer 24b can contain dopants induced by the ion implantation 210 which can contribute to the possibility of TED. Removal of the polymer layer 24b and the remaining spacers 24a reduces the possibility of TED and improves the electrical reliability of the MOSFET.

Figure 2F:
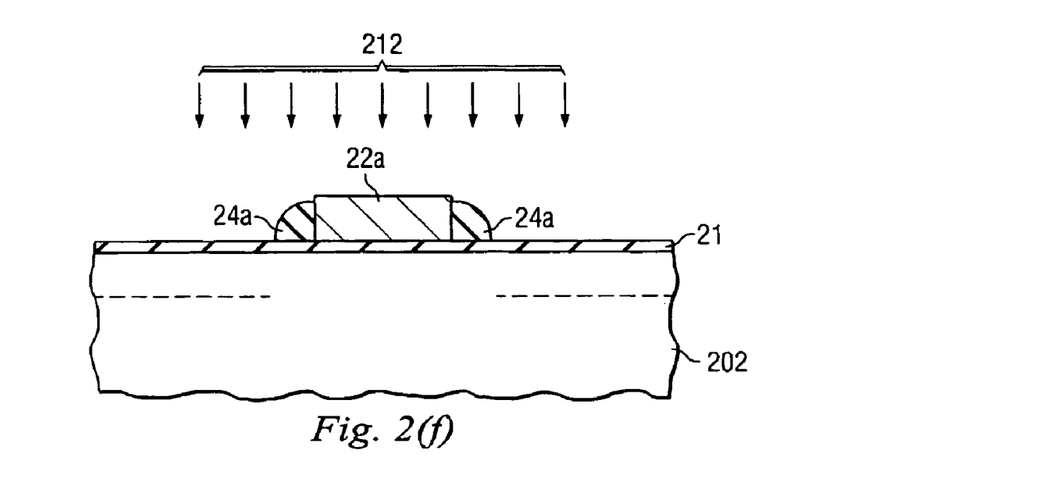

FIG. 2(f) illustrates the removal of the polymer layer 24b by a plasma etch process 212. The plasma etch process 212 can be a single substrate 10 process where a fluorine or perfluorocarbon chemistry is a prominent component of the process environment. For example, if the spacer 24a is composed of a polymer shell 24b and silicon nitride 24, an appropriate dry etch chemistry could include Ar and $O_2$ together with a plurality fluorine containing gas such as $CF_4$, $CHF_3$, $CH_2F_2$, or $CH_3F$, as the reactant species. The oxygen component of the plasma becomes partially ozone in the plasma environment which aids the removal of the polymer layer 24b, and adding the fluorine reactants can further help to remove the polymer layer 24b. The plasma etch process pressure can be on the order of 40 to 300 mTorr.

Figure 2G:
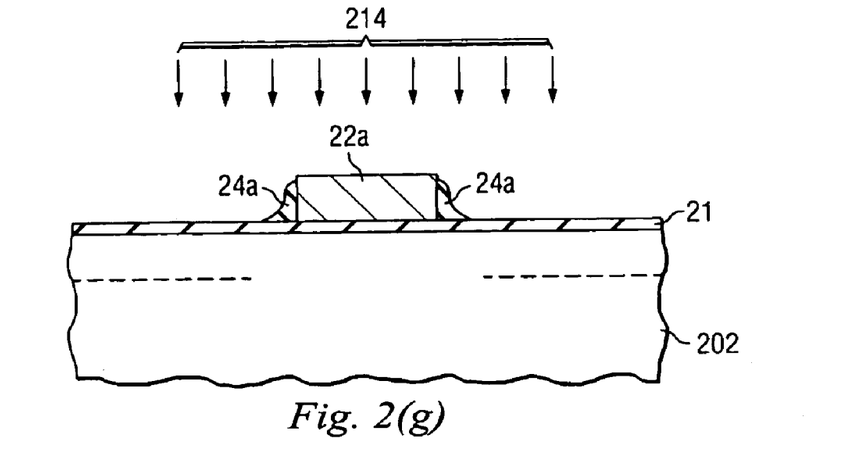

FIG. 2(g) illustrates the removal of the silicon nitride layer 24 of the spacer 24a which can be effectively removed by a wet etch with $H_3PO_4$ followed by wet etch with HF (collectively designated with the reference numeral 214).

Figure 2H:
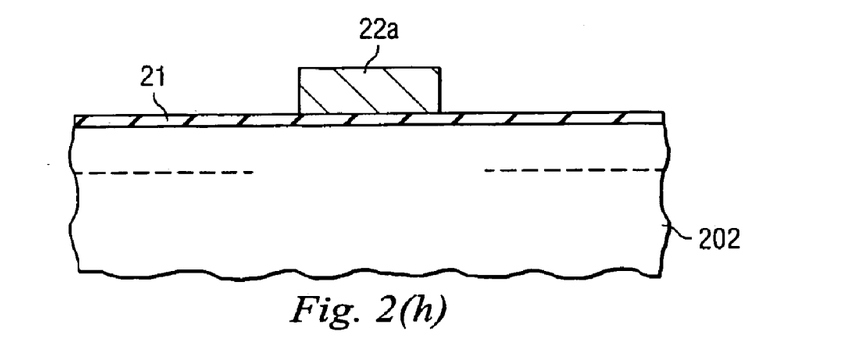

Referring now to FIG. 2(h), after the removal of the polymer layer 24b and the spacers 24a, the MOSFET gate stack 22a can be free of dopants, significantly reducing the possibility of TED.

Figure 2I:
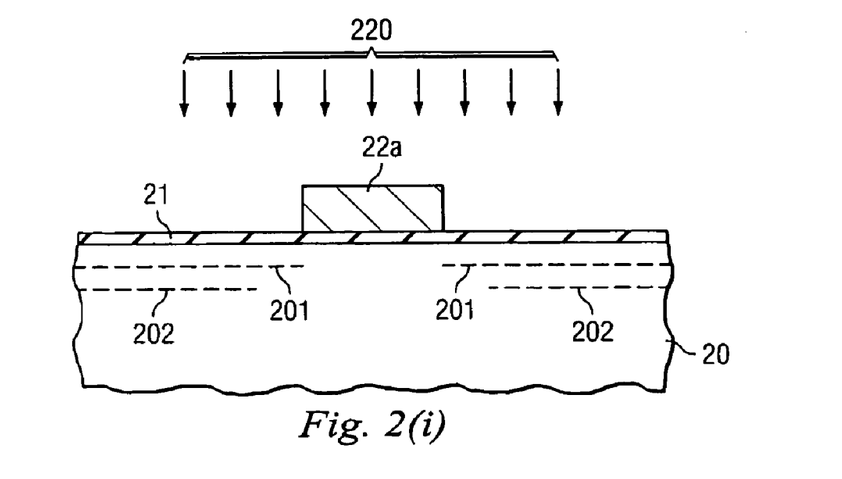

Referring now to FIG. 2(i), using the gate electrode 22a as a mask, a second ion implantation 220 can be employed in which phosphorus ions, for example, can be implanted over the entire surface of the resulting structure of FIG. 2(h) to form the lightly doped N-type source/drain regions 201 which can have relatively shallow junctions within the semiconductor substrate 20. The second ion implantation 220 can involve a dose amount of about $1 \times 10^{13}$ to $3 \times 10^{13}$ (atoms/cm$^3$) and an implanting energy of about 10 to 30 keV, for example.

Figure 2J:
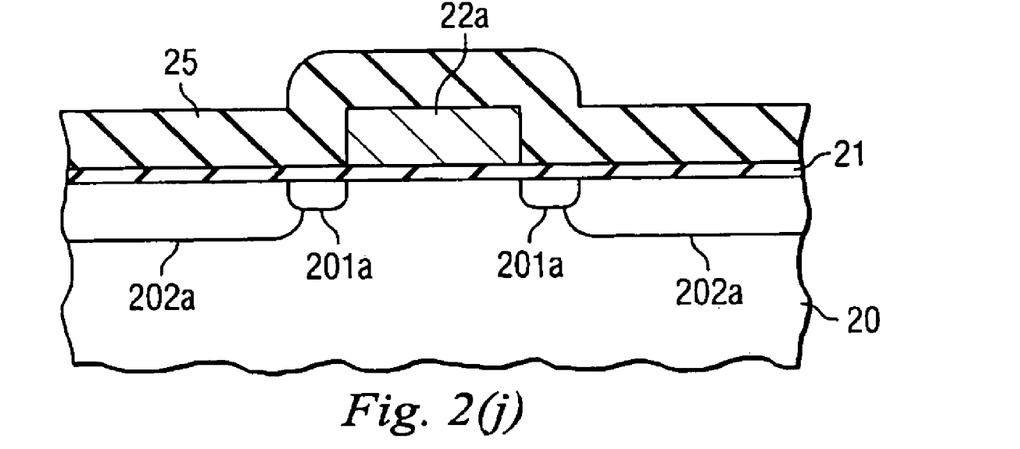

The resulting structure can then be annealed through an appropriate process such as a RTA process at a temperature of about 950° C. to 1050° C. for about 10 to 60 seconds, for example. Therefore, any damage or defects generated by the second ion implantation 220 are eliminated. Finally, referring to FIG. 2(j), an isolation or dielectric layer 25 can be deposited over the entire structure that was formed after the annealing process.

Figure 3:
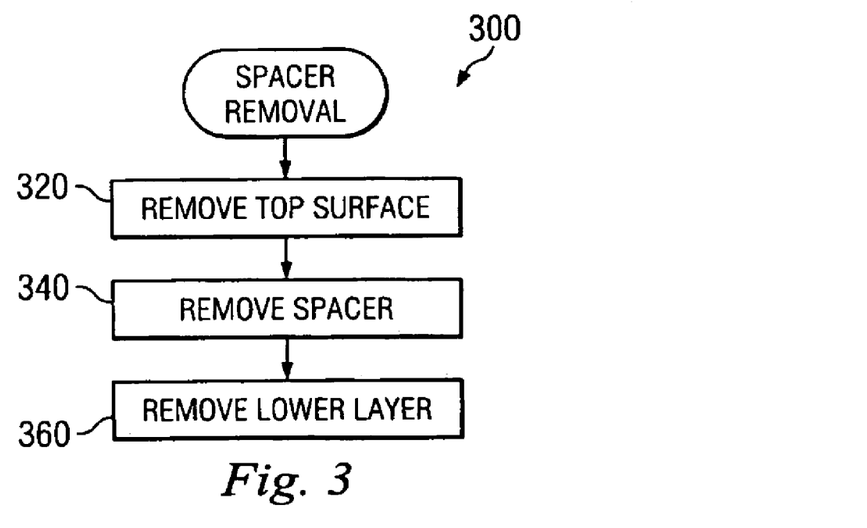
FIG. 3 is a block diagram illustrating the method of removal of a spacer in accordance with the present invention.

Referring now to FIG. 3, a method 300 can be used for effectively removing a spacer, such as for use in fabricating a LDD. It is common that the spacer includes a hardened top layer, such as the hard polymer layer 16a formed over the spacer 15a of FIG. 1(f). The spacer removal process may begin at step 320 with a removal of the top surface by a dry etch or a light plasma etch. The light plasma etch can use, for example, one or more of the chemistries: Ar, $O_2$ $CF_4$, $CHF_3$, $CH_2F_2$, or $CH_3F$. Execution then proceeds to step 340 for the removal of the spacer. Step 340 may utilize a separate etching process that is specifically selected for removing the spacer. For example, wet etch process may use an etchant such as $H_3PO_4$. After removal of the spacer, execution proceeds to step 360 to remove any underlying layers, such as an oxide layer, using another etch. Examples include a second light wet etch using HF acid, or even another plasma etch with a different etch chemistry and process environment. It is understood that two or more of the three etches 320, 340, 360 can be performed in a common processing chamber.

The present embodiments provide many advantages. In both the inverse source/drain LDD process and the non-inverse source/drain LDD process described above, TED can be greatly reduced using the spacer removal method of the present invention. Another advantage is the low thermal budget required. The semiconductor substrate temperature can be kept at a low temperature between the time when the spacers 24 are formed and removed which reduces the likelihood of TED as compared to other disposable spacer methods which require temperature in excess of 650° C. and/or substantially large bias. It is understood that advantages can be different for different embodiments, and the description of advantage for some embodiments is not intended to further limit the invention.

The present invention has been described relative to a preferred embodiment. Improvements or modifications that become apparent to persons of ordinary skill in the art only after reading this disclosure are deemed within the spirit and scope of the application. Specifically, the removal of spacers by a combination of dry or plasma etching and wet or chemical etching as described above is not limited to a family of semiconductor devices and may be used to treat other metal silicon-based surfaces of any shape planar, curved, spherical, or three-dimensional. Although the present invention is described in detail with reference to the process of removing spacers in the formation of LDD structures for n-type metal oxide semiconductor (NMOS) devices, it can be used with other types of semiconductor devices as well. For example, the present invention is applicable to PMOS (P-type MOS), CMOS (complementary MOS), and other structures where such spacers can be utilized.

It is understood that modifications, changes and substitutions are intended in the forgoing disclosure and in some instances some features of the invention will be employed without a corresponding use of other features. Accordingly, it is appropriate that the appended claims be construed broadly and in a manner consistent with the scope of the invention.

We claim:

1. A system for fabricating a lightly doped drain (LDD) region on a semiconductor substrate, the system comprising:
   means for creating a spacer;
   first means for implanting a first relatively heavily doped region with the spacer in place;
   one or more chambers for removing the spacer, the one or more chambers configured for:
      applying a first dry removal process to remove a layer on the spacer formed by the first means, the first dry removal process utilizing a fluorine-contained plasma; and
      applying a second wet etch process to remove the spacer; and second means for implanting the LDD region with the spacer removed;
   wherein the one or more chambers for removing the spacer include a supply for providing $H_3PO_4$ acid to the second wet etch process.

2. A system for fabricating a lightly doped drain (LDD) region on a semiconductor substrate, the system comprising:
   means for creating a spacer;
   first means for implanting a first relatively heavily doped region with the spacer in place;
   one or more chambers for removing the spacer, the one or more chambers configured for:
      applying a first dry removal process to remove a layer on the spacer formed by the first means, the first dry removal process utilizing a fluorine-contained plasma; and
      applying a second wet etch process to remove the spacer;
   second means for implanting the LDD region with the spacer removed; and
      applying a third wet etch process to remove an oxide layer underlying the spacer.

3. The system of claim 2 wherein the first and second means for implanting are ion implantation process chambers.

4. The system of claim 2 wherein the first dry removal process is a plasma etch process.

5. The system of claim 2 wherein the one or more chambers for removing the spacer include a supply for providing perfluorocarbon gas to the first dry process.

6. The system of claim 2 wherein the first dry removal process uses a plasma etch with a radio frequency (RF) power less than 1000 W.

7. The system of claim 2 wherein the first dry removal process uses a plasma etch with a pressure less than 300 mTorr.

8. The system of claim 2 wherein the means for forming a spacer is a chamber for performing silicon nitride chemical vapor deposition.

9. The system of claim 2 wherein the first dry removal process uses an ashing process utilizing oxygen and a fluorine-contained plasma.

* * * * *